United States Patent
Ito

(10) Patent No.: US 11,978,745 B2
(45) Date of Patent: May 7, 2024

(54) ELECTRO-OPTICAL DEVICE, METHOD FOR MANUFACTURING ELECTRO-OPTICAL DEVICE, AND ELECTRONIC APPARATUS

(71) Applicant: SEIKO EPSON CORPORATION, Tokyo (JP)

(72) Inventor: Satoshi Ito, Eniwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 386 days.

(21) Appl. No.: 17/015,174

(22) Filed: Sep. 9, 2020

(65) Prior Publication Data
US 2021/0074739 A1 Mar. 11, 2021

(30) Foreign Application Priority Data

Sep. 10, 2019 (JP) ................................ 2019-164874

(51) Int. Cl.
*H01L 27/12* (2006.01)
*G02F 1/1362* (2006.01)

(52) U.S. Cl.
CPC .... *H01L 27/1255* (2013.01); *G02F 1/136213* (2013.01); *H01L 27/124* (2013.01); *H01L 27/127* (2013.01)

(58) Field of Classification Search
CPC .............. H01L 27/1255; H01L 27/124; G02F 1/136213; G02F 1/136286
See application file for complete search history.

(56) References Cited

U.S. PATENT DOCUMENTS

| 5,162,933 | A | * | 11/1992 | Kakuda | G02F 1/136213 257/59 |
| 6,005,648 | A | | 12/1999 | Zhang et al. | |
| 6,097,454 | A | | 8/2000 | Zhang et al. | |
| 2002/0113934 | A1 | | 8/2002 | Aoki | |
| 2008/0198108 | A1 | | 8/2008 | Aoki | |
| 2011/0266545 | A1 | * | 11/2011 | Won | H01L 27/124 257/59 |
| 2014/0070208 | A1 | * | 3/2014 | Yamazaki | H01L 27/1255 257/43 |

(Continued)

FOREIGN PATENT DOCUMENTS

| JP | H10-010581 A | 1/1998 |
| JP | 2002-006773 A | 1/2002 |

(Continued)

*Primary Examiner* — Peter M Albrecht
(74) *Attorney, Agent, or Firm* — Oliff PLC

(57) ABSTRACT

An electro-optical device includes a pixel electrode disposed in a display area, a first wiring line, a second wiring line, an insulating layer disposed between the first wiring line and the second wiring line, a capacitor disposed in the display area, and including a first electrode, a capacitance insulation film, and a second electrode stacked in this order on the second wiring layer side surface of the insulating layer, with the first electrode being electrically connected to the second wiring line, and a relay electrode disposed outside the display area, and through the insulating layer, contacted with the first wiring line at the insulating layer side surface of the first wiring layer line and the second wiring line at an opposite side surface of the second wiring line with respect to the insulating layer side.

9 Claims, 8 Drawing Sheets

(56) References Cited

U.S. PATENT DOCUMENTS

| | | |
|---|---|---|
| 2017/0343873 A1 | 11/2017 | Ma |
| 2018/0067368 A1 | 3/2018 | Izawa et al. |
| 2018/0210299 A1* | 7/2018 | Mochizuki ........ G02F 1/136286 |
| 2020/0176481 A1* | 6/2020 | Takeda .................. H01L 27/124 |

FOREIGN PATENT DOCUMENTS

| | | |
|---|---|---|
| JP | 2009-122253 A | 6/2009 |
| JP | 2009-122256 A | 6/2009 |
| JP | 2010-128421 A | 6/2010 |
| JP | 2018-040969 A | 3/2018 |

* cited by examiner

ELECTRO-OPTICAL DEVICE, METHOD FOR MANUFACTURING ELECTRO-OPTICAL DEVICE, AND ELECTRONIC APPARATUS

The present application is based on, and claims priority from JP Application Serial Number 2019-164874, filed Sep. 10, 2019, the disclosure of which is hereby incorporated by reference herein in its entirety.

BACKGROUND

1. Technical Field

The present disclosure relates to an electro-optical device, a method for manufacturing an electro-optical device, and an electronic apparatus.

2. Related Art

An electro-optical device such as a liquid crystal device, which is a light valve, is used in an electronic apparatus such as a projector. This type of electro-optical device includes, for example, a pixel electrode and a retention capacitor that holds a potential of the pixel electrode, as disclosed in JP-A-2018-40969.

In JP-A-2018-40969, the retention capacitor is formed by stacking a first capacitance electrode, a dielectric layer, and a second capacitance electrode in this order on an insulating film. In the insulating film is formed a trench portion that leads to a wiring line having a fixed potential and positioned below the insulating film. The first capacitance electrode is connected, via the trench portion, to the wiring line.

In the device described in JP-A-2018-40969, the trench portion described above must be formed before formation of the first capacitance electrode. Therefore, in a case in which a contact separate from the trench portion is to be formed on the insulating film after formation of the first capacitance electrode, the contact must be formed in a step separate from that of the trench portion and, as a result, there is the problem that the manufacturing process becomes complicated.

SUMMARY

According to an aspect of the present disclosure, an electro-optical device includes a pixel electrode disposed in a display area, a first wiring line, a second wiring line, an insulating layer disposed between the first wiring line and the second wiring line, a capacitor disposed in the display area, and including a first electrode, a capacitance insulation film, and a second electrode stacked in this order on the second wiring layer side surface of the insulating layer, with the first electrode being electrically connected to the second wiring line, and a relay electrode disposed outside the display area, and through the insulating layer, contacted with the first wiring line at the insulating layer side surface of the first wiring line and the second wiring line at an opposite side surface of the second wiring line with respect to the insulating layer side.

According to another aspect of the present disclosure, a method for manufacturing an electro-optical device includes forming an insulating layer at a first line, forming a second wiring line and a first electrode at the insulating layer, forming a capacitance insulation film at the first electrode, forming a through hole configured to reach the first wiring line in the insulating layer, forming a second electrode at the capacitance insulation film, and forming a relay electrode configured to couple, via the through hole, to the first wiring line and the second wiring line.

DESCRIPTION OF EXEMPLARY EMBODIMENTS

Figure 1:
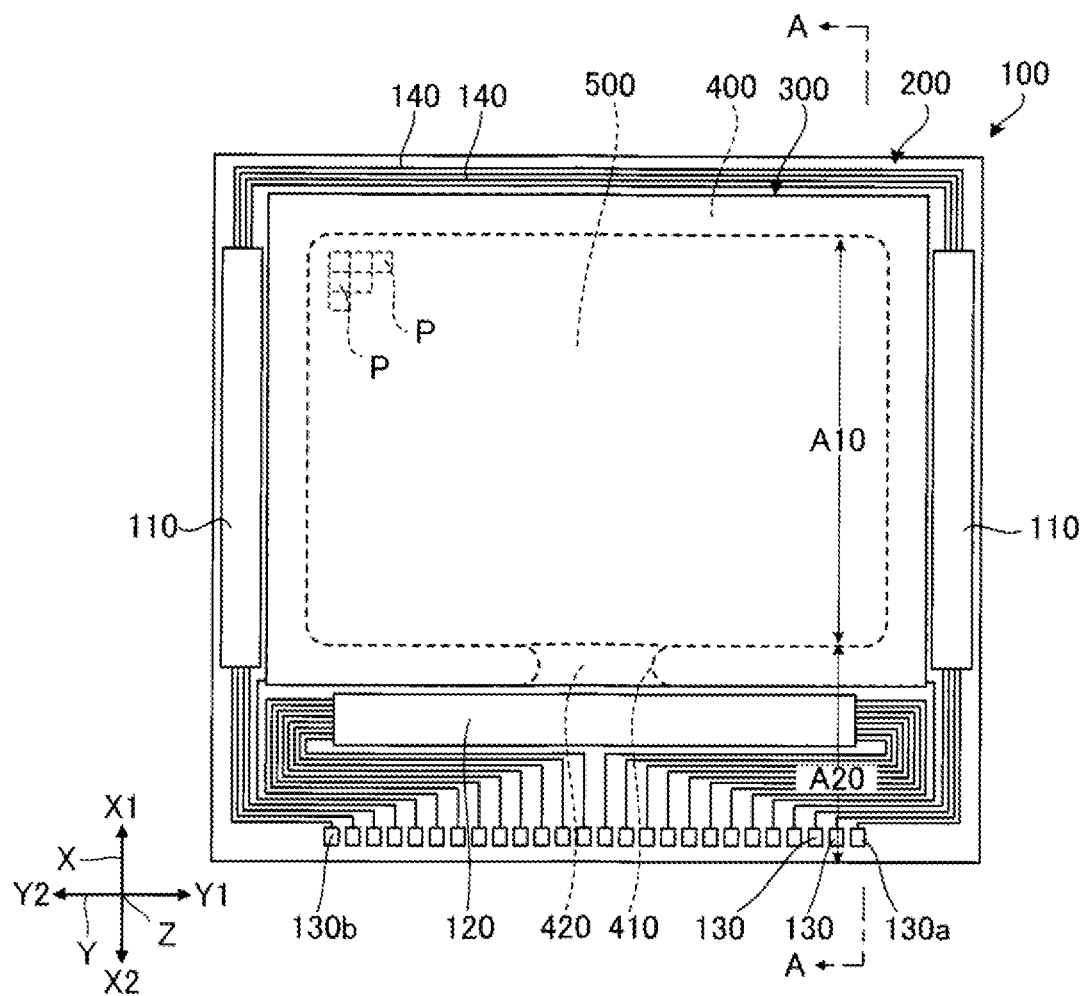
FIG. 1 is a schematic plan view of an electro-optical device according to an exemplary embodiment.

Preferred embodiments of the present disclosure will be described below with reference to the accompanying drawings. Note that, in the drawings, dimensions and scales of sections are differed from actual dimensions and scales as appropriate, and some of the sections are schematically illustrated to make them easily understood. Further, the scope of the present disclosure is not limited to these exemplary embodiments unless otherwise stated to limit the present disclosure in the following descriptions.

1. Electro-Optical Device 1-1. Basic Configuration of Electro-Optical Device 100

Figure 2:
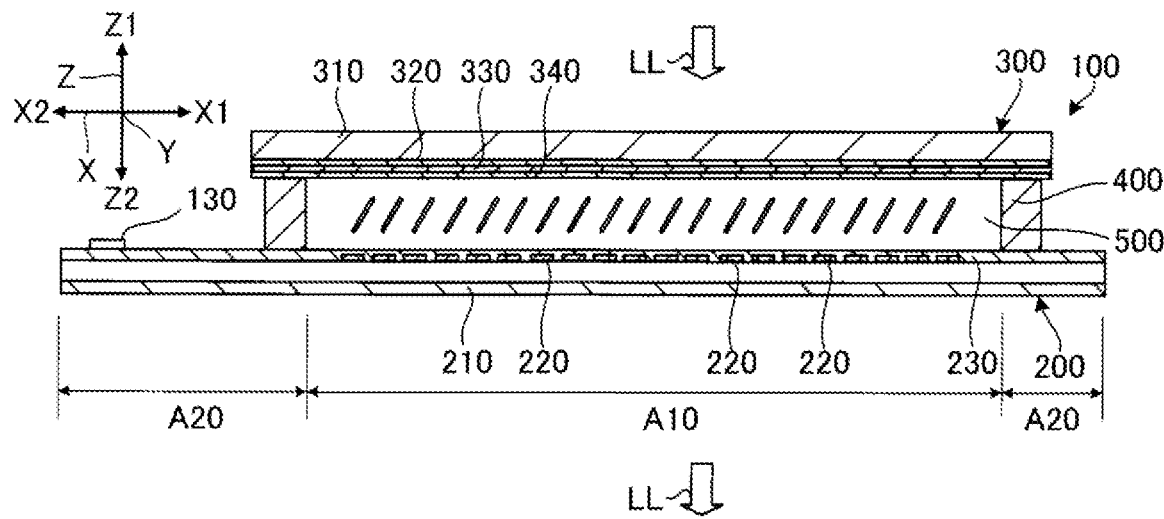
FIG. 2 is a cross-sectional view taken along line A-A in FIG. 1.

FIG. 1 illustrates a schematic plan view of an electro-optical device 100 according to an exemplary embodiment. FIG. 2 is a cross-sectional view taken along line A-A in FIG. 1. Note that, for convenience of explanation, description will be made using, as appropriate, an X-axis, a Y-axis, and a Z-axis orthogonal to each other. Further, one direction along the X-axis is referred to as an X1 direction, and a direction opposite to the X1 direction is referred to as an X2 direction.

Similarly, one direction along the Y-axis is referred to as a Y1 direction, and a direction opposite to the Y1 direction is referred to as a Y2 direction. One direction along the Z-axis is referred to as a Z1 direction, and a direction opposite to the Z1 direction is referred to as a Z2 direction.

The electro-optical device 100 illustrated in FIG. 1 and FIG. 2 is a transmission-type liquid crystal display device driven by an active matrix. As illustrated in FIG. 2, the electro-optical device 100 includes an element substrate 200 having transmissivity, a counter substrate 300 having transmissivity, a sealing member 400 having a frame shape, and a liquid crystal layer 500. The sealing member 400 is disposed between the element substrate 200 and the counter substrate 300. The liquid crystal layer 500 is disposed in a region surrounded by the element substrate 200, the counter substrate 300, and the sealing member 400. Here, the element substrate 200, the liquid crystal layer 500, and the counter substrate 300 are arranged along the Z-axis. A thickness direction of the element substrate 200 or the counter substrate 300 is along the Z-axis. In the following, a view from the Z1 direction or the Z2 direction is referred to as "plan view".

In the electro-optical device 100 of this exemplary embodiment, a light LL is incident on the element substrate 200, transmitted through the liquid crystal layer 500, and emitted from the counter substrate 300. Note that the light LL is visible light. "Transmissive" or "transmissivity" means transmittance to visible light, and preferably means that the transmittance of visible light is greater than or equal to 50%. Further, while the electro-optical device 100 illustrated in FIG. 1 has a rectangular shape in plan view, the shape in plan view of the electro-optical device 100 is not limited thereto and may be a circular shape or the like, for example.

The element substrate 200 is a substrate in which a plurality of pixel electrodes 220 are provided as individual electrodes. More specifically, as illustrated in FIG. 2, the element substrate 200 includes a first base 210, the plurality of pixel electrodes 220, and a first alignment film 230. The first base 210 is constituted by a flat plate having transmissivity and insulating properties. The pixel electrodes 220 each have transmissivity and are composed of a transparent conductive material such as indium tin oxide (ITO) or indium zinc oxide (IZO), for example. The first alignment film 230 is positioned closest to the liquid crystal layer 500 in the element substrate 200, and aligns the liquid crystal molecules of the liquid crystal layer 500. Examples of the constituent material of the first alignment film 230 include polyimide, silicon oxide, and the like. Note that a detailed configuration of the element substrate 200 will be described later.

The counter substrate 300 is a substrate in which a counter electrode 330 is provided as a common electrode. More specifically, as illustrated in FIG. 2, the counter substrate 300 includes a second base 310, an insulating layer 320, the counter electrode 330, and a second alignment film 340. The second base 310, the insulating layer 320, the counter electrode 330, and the second alignment film 340 are arranged in this order. Of these, the second alignment film 340 is positioned closest to the liquid crystal layer 500. The second base 310 is constituted by a flat plate having transmissivity and insulating properties. The second base 310 is composed of glass, quartz, or the like, for example. The counter electrode 330 is composed of a transparent conductive material such as ITO or IZO, for example. Further, the second alignment film 340 aligns the liquid crystal molecules of the liquid crystal layer 500. Examples of the constituent material of the second alignment film 340 include polyimide, silicon oxide, and the like.

The sealing member 400 is, for example, a frame-shaped member formed using an adhesive containing various types of curable resins such as epoxy resin, or the like. The sealing member 400 is affixed to each of the element substrate 200 and the counter substrate 300. An injection port 410 for injecting a liquid crystal material containing liquid crystal molecules inside the sealing member 400 is formed in a portion of the sealing member 400 in a peripheral direction. The injection port 410 is sealed with a sealing material 420 formed using various types of resin materials.

The liquid crystal layer 500 is an electro-optical layer disposed between the plurality of pixel electrodes 220 and the counter electrode 330, and changes in optical characteristics in accordance with an electric field. More specifically, the liquid crystal layer 500 contains liquid crystal molecules having positive or negative dielectric anisotropy. The liquid crystal layer 500 is interposed between the element substrate 200 and the counter substrate 300 such that the liquid crystal molecules are in contact with both the first alignment film 230 and the second alignment film 340. The alignment of the liquid crystal molecules contained in the liquid crystal layer 500 varies depending on the voltage applied to the liquid crystal layer 500. A modulation of the light LL allows the liquid crystal layer 500 to perform grayscale display in accordance with the applied voltage.

As illustrated in FIG. 1, a plurality of scanning line drive circuits 110, a signal line drive circuit 120, and a plurality of external terminals 130 are disposed on the surface of the element substrate 200 closer to the counter substrate 300. The plurality of external terminals 130 each include external terminals 130a, 130b to which a fixed potential is supplied. The external terminal 130a is an example of a "first external connection terminal", and the external terminal 130b is an example of a "second external connection terminal". Lead wiring lines 140 respectively drawn from the scanning line drive circuit 110 and the signal line drive circuit 120 are electrically connected to the external terminals 130. Note that the external terminal 130b may be referred to as the "first external connection terminal" and the external terminal 130a may be referred to as the "second external connection terminal".

The electro-optical device 100 having the configuration described above includes a display area A10 that displays an image, and a peripheral area A20 that surrounds the display area A10 in plan view. The display area A10 is provided with a plurality of pixels P arranged in a matrix pattern. One pixel electrode 220 is disposed per pixel P. The scanning line drive circuits 110, the signal line drive circuit 120, and the like are disposed in the peripheral area A20.

1-2. Electrical Configuration of Element Substrate 200

Figure 3:
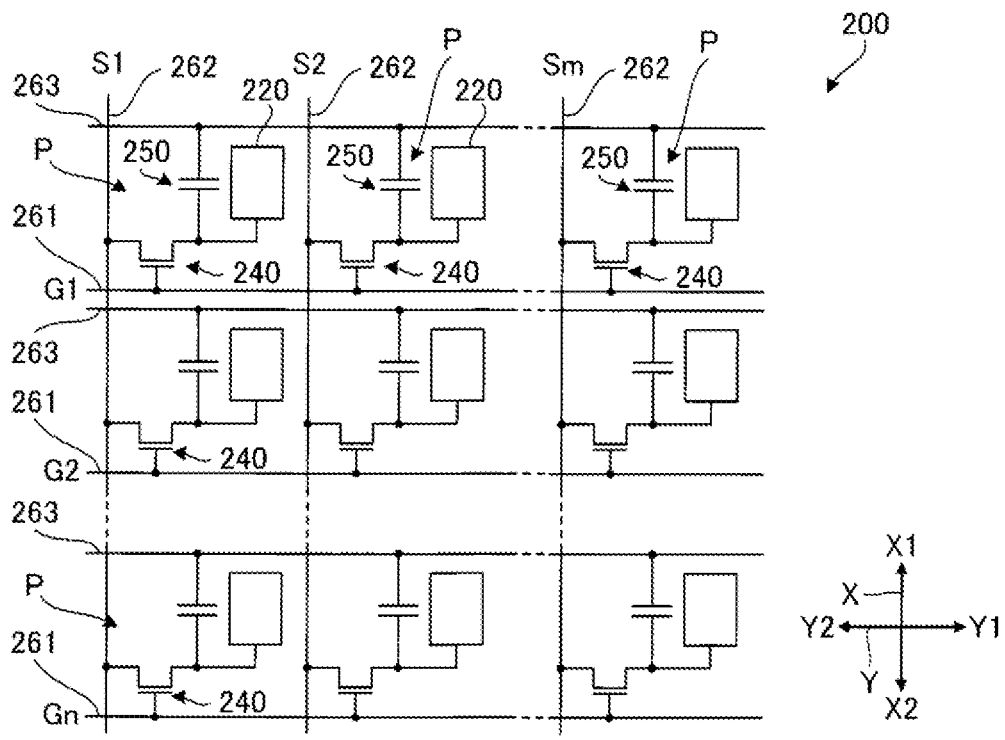
FIG. 3 is an equivalent circuit diagram illustrating an electrical configuration of an element substrate.

FIG. 3 is an equivalent circuit diagram illustrating an electrical configuration of the element substrate 200. As illustrated in FIG. 3, the element substrate 200 is provided with n scanning lines 261, m data lines 262, and n capacitance lines 263. Note that n and m are each an integer of 2 or more. A thin-film transistor (TFT) 240 serving as a switching element is disposed correspondingly to each of the intersections between the n scanning lines 261 and the m data lines 262. Although not illustrated, the TFTs 240 are each disposed in a position overlapping with the scanning line 261 or the signal line 262 in plan view.

The n scanning lines 261 each extend along the Y-axis and are arranged at equal intervals along the X-axis. The scanning line 261 is electrically connected to a gate of the corresponding TFT 240. Further, the n scanning lines 261 are electrically connected to the scanning line drive circuits 110 illustrated in FIG. 1. Scanning signals G1, G2, . . . , Gn are line-sequentially supplied from the scanning line drive circuits 110 to the n scanning lines 261.

The m signal lines 262 illustrated in FIG. 3 each extend along the X-axis and are arranged at equal intervals along the Y-axis. The signal line 262 is electrically connected to a source of the corresponding TFT 240. Further, the m signal lines 262 are electrically connected to the signal line drive circuit 62 illustrated in FIG. 1. Image signals S1, S2, . . . , Sm are supplied in parallel from the signal line drive circuit 120 illustrated in FIG. 1 to the m signal lines 262.

The n scanning lines 261 and the m signal lines 262 illustrated in FIG. 3 are electrically insulated from each other and disposed in a lattice-like manner in plan view. A region surrounded by two adjacent scanning lines 261 and two adjacent data lines 262 corresponds to the pixel P. The pixel electrode 220 is electrically connected to a drain of the TFT 240. Although not illustrated, the pixel electrode 220 is disposed across a range overlapping with a region surrounded by two adjacent scanning lines 261 and two adjacent signal lines 262 in plan view.

The n capacitive lines 263 each extend along the Y-axis and are arranged at equal intervals along the X-axis. Further, the n capacitance lines 263 are electrically insulated from the plurality of signal lines 262 and the plurality of scanning lines 261, and are disposed apart from these lines. A fixed potential such as a ground potential is applied to the capacitance lines 263. Further, a storage capacitor 250 is connected in parallel to a liquid crystal capacitor, between the capacitance line 263 and the pixel electrode 220, to prevent leakage of electrical charge held in the liquid crystal capacitor. The storage capacitor 250 is an example of a "capacitor". Although not illustrated, the storage capacitor 250 is disposed in a position overlapping with the scanning line 261 or the signal line 262 in plan view.

The scanning signals G1, G2, . . . , Gn become sequentially active and, when the n scanning lines 261 are sequentially selected, the TFT 240 connected to the selected scanning line 261 is turned to an ON state. Then, the image signals S1, S2, . . . , Sm having magnitudes commensurate with the grayscale to be displayed are transmitted, via the m data lines 262, to the pixel P corresponding to the selected scanning line 261, and are then applied to the pixel electrodes 220. This allows a voltage corresponding to the grayscale to be displayed to be applied to the liquid crystal capacitor formed between the pixel electrode 220 and the counter electrode 330 of the counter substrate 300 illustrated in FIG. 2, and the alignment of the liquid crystal molecules varies in accordance with the applied voltage. Further, the applied voltage is held by the storage capacitor 250. Such a variation in the alignment of the liquid crystal molecules causes the light LL to be modulated, and thus the grayscale display is enabled.

1-3. Detailed Description of Element Substrate

Figure 4:
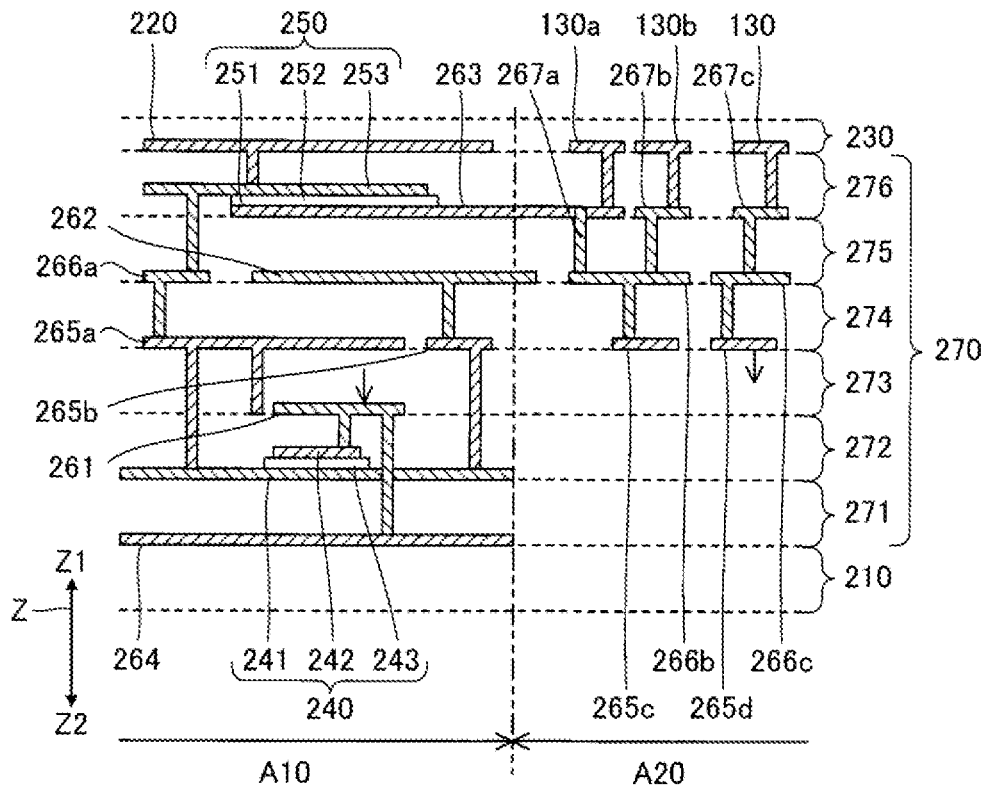
FIG. 4 is a cross-sectional view schematically illustrating a layer configuration of the element substrate.

FIG. 4 is a cross-sectional view schematically illustrating a layer configuration of the element substrate 200. In FIG. 4, a portion of the display area A10 and the peripheral area A20 described above is representatively illustrated in relation to the configuration pertaining to one pixel P. Note that, in FIG. 4, the configuration of each portion is schematically illustrated for ease of understanding.

As illustrated in FIG. 4, in addition to the components described above, the element substrate 200 includes an insulating laminate 270, a plurality of light-shielding bodies 264, a drain wiring line 265a, a source wiring line 265b, a plurality of wiring lines 265c, 265d, 266a, 266b, 266c, 267b, 267c, and a relay electrode 267a.

The first base 210, the insulating laminate 270, and the first alignment film 230 are stacked in this order. The plurality of light-shielding bodies 264 are disposed between the first base 210 and the insulating laminate 270. The plurality of pixel electrodes 220 are disposed between the insulating laminate 270 and the first alignment film 230. Between the layers of the insulating laminate 270, the plurality of TFTs 240, the plurality of storage capacitors 250, the drain wiring line 265a, the source wiring line 265b, the plurality of wiring lines 265c, 265d, 266a, 266b, 266c, 267b, 267c, and the relay electrode 267a are disposed as appropriate. Note that a lens array including a lens surface for each pixel P may be provided between the first base 210 or the first alignment film 230 and the insulating laminate 270. The lens array includes an interface where the lens surface is formed, and is configured by a laminate of two layers having different refractive indexes, for example.

Each of the plurality of light-shielding bodies 264 is a film having a light-shielding property. Although not illustrated, the plurality of light-shielding bodies 264 are arranged in rows and columns overlapping with the TFTs 240 in plan view. Therefore, light incident on the TFTs 240 from the first base 210 can be reduced by the light-shielding bodies 264. The light-shielding body 264 of this exemplary embodiment has a light-shielding property as well as conductivity. Examples of the constituent material of the light-shielding body 264 include a metal, an alloy, a metal silicide, or the like of tungsten (W), titanium (Ti), chromium (Cr), iron (Fe), aluminum (Al), or the like. Among these, tungsten is preferable. Among the various metals, tungsten is excellent in heat resistance and has an optical density (OD) value that does not readily decrease even when heat treatment is performed during manufacturing, for example. Therefore, including tungsten in the light-shielding body 264 makes it possible to prevent the incidence of light on the TFT 240 by the light-shielding body 264 particularly effectively. The light-shielding body 264 described above is formed by a known film formation method. Note that the light-shielding body 264 may be disposed within a recessed portion provided in the first base 210. The recessed portion is formed by, for example, a damascene method.

The insulating laminate 270 is a laminate of layers having transmissivity and insulating properties. The insulating laminate 270 includes insulating layers 271, 272, 273, 274, 275, 276. These films are stacked in this order from the first base 210 side toward the first alignment film 230 side. Each of the insulating layers 271, 272, 273, 274, 275, 276 is composed of, for example, silicon oxide or the like. The insulating layers 271, 272, 273, 274, 275, 276 described above are each formed using, for example, a thermal oxidation method, a chemical vapor deposition (CVD) method, or the like.

The TFT 240 is disposed between the insulating layer 271 and the insulating layer 272. The scanning line 261 is disposed between the insulating layer 272 and the insulating layer 273. The drain wiring line 265a, the source wiring line 265b, the wiring line 265c, and the wiring line 265d are disposed between the insulating layer 273 and the insulating layer 274. The signal line 262, the wiring lines 266a, 266b, 266c are disposed in a first wiring layer that displosed between the insulating layer 274 and the insulating layer 275. The wiring line 266b is an example of a "first wiring line". The storage capacitor 250, the capacitance line 263, the relay electrode 267a, and the wiring lines 267b, 267c are disposed in a second wiring layer that displosed between the insulating layer 275 and the insulating layer 276.

The TFT 240 includes a semiconductor layer 241, a gate electrode 242, and a gate insulating film 243. These are stacked in this order from the insulating layer 271 side toward the insulating layer 272 side. Although not illustrated, the semiconductor layer 241 includes a source area, a drain area, and a channel area. The channel area is positioned between the source area and the drain area. The semiconductor layer 241 is formed by, for example, forming a film of polysilicon, and the area excluding the channel area is doped with impurities that enhances conductivity. The gate electrode 242 overlaps with the channel area of the semiconductor layer 241 in plan view. The gate electrode 242 is formed by, for example, doping polysilicon with impurities that enhance conductivity. Note that the gate electrode 242 may be composed of a material having conductivity, such as a metal, a metal silicide, or a metal compound. The gate insulating film 243 is interposed between the gate electrode 242 and the channel area of the semiconductor layer 241. The gate insulating film 243 is composed of a silicon oxide film formed by thermal oxidation or CVD, for example.

The scanning line 261 is connected to the gate electrode 242 of the TFT 240. The scanning line 261 of this exemplary embodiment is connected to the gate electrode 242 as well as the light-shielding body 264 having conductivity described above. Therefore, the light-shielding body 264 functions as a gate electrode for the TFT 240 along with the gate electrode 242. The scanning line 261 is electrically connected, via the wiring lines 265d, 266c, 267c, to the external terminal 130.

The source wiring line 265b is connected to the source of the TFT 240. The source wiring line 265b is connected to the signal line 262. Although not illustrated, similar to the scanning line 261, the signal line 262 is electrically connected, via the wiring lines 265d, 266c, 267c, which differ from those of the scanning line 261, to the external terminal 130, which differs from that of the scanning line 261. On the other hand, the drain wiring line 265a is connected to the drain of the TFT 240. The drain wiring line 265a is connected, via the wiring line 266a, to the storage capacitor 250.

The storage capacitor 250 includes a first electrode 251, a capacitance insulation film 252, and the second electrode 253. These are stacked in this order from the insulating layer 275 side toward the insulating layer 276 side. The first electrode 251 and the second electrode 253 are each formed by forming a film of a metal, an alloy, a metal silicide, or the like of tungsten (W), titanium (Ti), chromium (Cr), iron (Fe), aluminum (Al), or the like, for example. Specifically, for example, the first electrode 251 and the second electrode 253 are each formed of a laminate of a titanium nitride film, an aluminum film, and a titanium nitride film. Further, the capacitance insulation film 252 is composed of a multilayer film of a hafnium oxide film and an aluminum oxide film formed by an atomic layer deposition (ALD) method or the like, for example. Note that the capacitance insulation film 252 may be composed of a silicon oxide film.

A capacitance line 263, which is an example of a second wiring line, is connected to the first electrode 251 of the storage capacitor 250. The capacitance line 263 of this exemplary embodiment is integrated with the first electrode 251. The capacitance line 263 is electrically connected to the external terminal 130a. Further, the capacitance line 263 is also electrically connected, via the relay electrode 267a and the wiring lines 266b, 267b, to the external terminal 130b. Therefore, fluctuation in each of the fixed potential from the external terminal 130a and the fixed potential from the external terminal 130b can be reduced. The relay electrode 267a is disposed outside the display area A10, that is, in the peripheral area A20. The wiring line 266b is connected to the wiring line 265c. The wiring line 265c is connected to a fixed potential line such as a shield wiring line (not illustrated). On the other hand, the second electrode 253 of the storage capacitor 250 is connected to the wiring line 266a and the pixel electrode 220. Note that the relay electrode 267a and the configuration associated therewith will be described in detail later.

Examples of the constituent materials of the scanning line 261, the signal line 262, the capacitance line 263, the drain wiring line 265a, the source wiring line 265b, the plurality of wiring lines 265c, 265d, 266a, 266b, 266c, 267b, 267c, and the relay electrode 267a described above include a metal, a metal nitride, and a metal silicide, or the like of tungsten, titanium, chromium, iron, aluminum, or the like. Specifically, for example, the scanning line 261, the signal line 262, the capacitance line 263, the drain wiring line 265a, the source wiring line 265b, the plurality of wiring lines 265c, 265d, 266a, 266b, 266c, 267b, 267c, and the relay electrode 267a are each composed of a laminate of a titanium nitride film, an aluminum film, and a titanium nitride film. These wiring lines include an aluminum film, which makes it possible to reduce resistance compared to a case in which the wiring lines are composed of only a titanium nitride film. Note that the contact portion between these wiring lines may be separate from the wiring lines described above. In this case, examples of the constituent material of the contact portion include a metal such as aluminum or tungsten.

1-4. Detailed Description of Relay Electrode 267a

Figure 5:
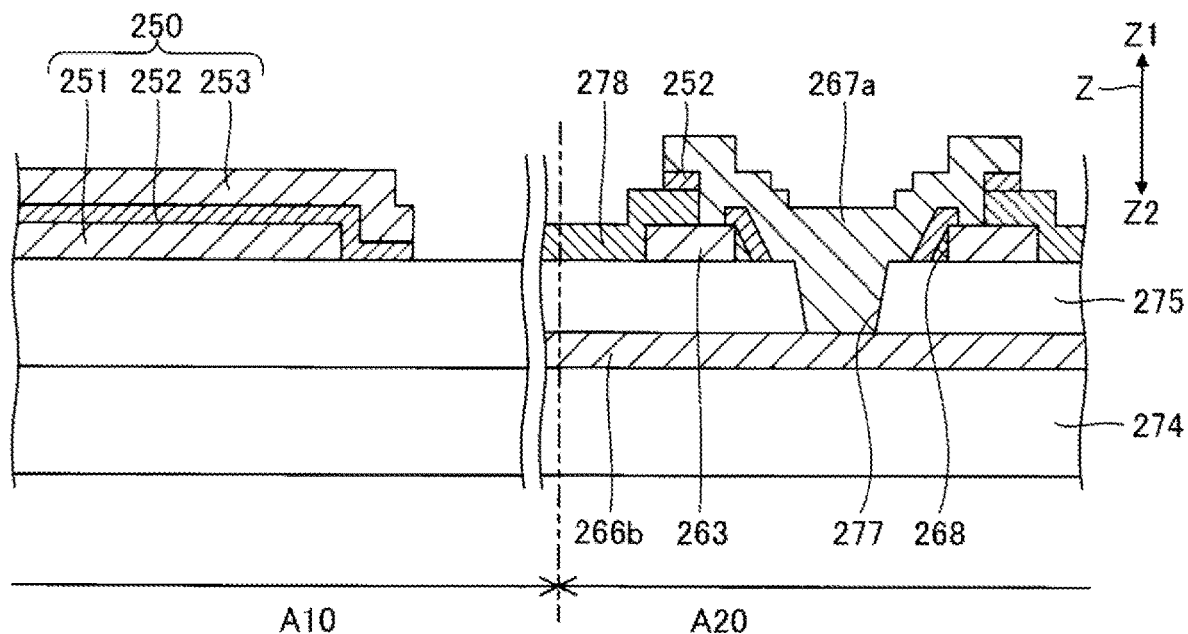
FIG. 5 is a cross-sectional view illustrating a capacitor and a relay electrode of the element substrate.
Figure 6:
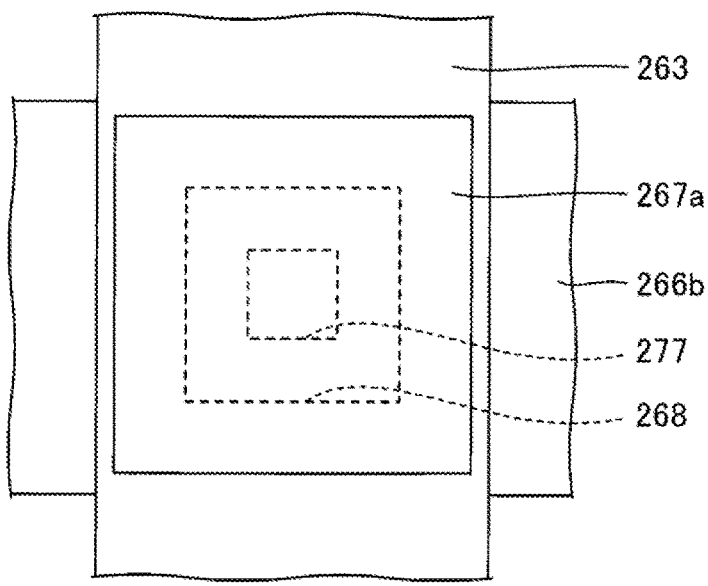
FIG. 6 is a plan view illustrating the relay electrode, a first wiring line, and a second wiring line illustrated in FIG. 5.

FIG. 5 is a cross-sectional view illustrating the storage capacitor 250 and the relay electrode 267a of the element substrate 200. In FIG. 5, a portion of the storage capacitor 250, the relay electrode 267a, and the peripheral structure thereof are schematically illustrated. FIG. 6 is a plan view illustrating the relay electrode 267a, the capacitance line 263, and the wiring line 266b illustrated in FIG. 5.

As illustrated in FIG. 5, a through hole 277 is provided in the insulating layer 275 disposed between the wiring line 266b and the capacitance line 263 having a fixed potential. The through hole 277 is a contact hole for electrically coupling the wiring line 266b and the capacitance line 263. As illustrated in FIG. 6, the through hole 277 is provided at a position overlapping with the wiring line 266a in plan view. In this exemplary embodiment, a through hole 268 is provided to the capacitance line 263, and the through hole 277 is positioned inside the through hole 268 in plan view. In FIG. 6, the through holes 268, 277 each have a square shape in plan view. Note that the shape in plan view of each of the through holes 268, 277 is not limited to a square, and may be, for example, a circle or the like. Further, the shapes in plan view of the through holes 268, 277 may be different from each other.

As described above, the capacitance line 263 is integrated with the first electrode 251 of the storage capacitor 250. The capacitance line 263 is composed of the same material as the first electrode 251, and is collectively formed in the same film formation step as that of the first electrode 251. Therefore, compared to a case in which the capacitance line 263 and the first electrode 251 are formed in separate film formation steps, the manufacturing process of the electro-optical device 100 is simplified.

As illustrated in FIG. 5, the relay electrode 267a passes through the through holes 268, 277, and couples the wiring line 266*b* and the capacitance line 263. With this coupling, the wiring line 266*b* and the capacitance line 263 are electrically coupled via the relay electrode 267*a*. Here, the relay electrode 267*a* is contacted with the surface of each of the wiring line 266*b* and the capacitance line 263 that faces the Z1 direction. As illustrated in FIG. 6, the relay electrode 267*a* is provided across a range covering the entire area of the through hole 268 in plan view. Then, the relay electrode 267*a* is contacted with the capacitance line 263 across the entire periphery of the through hole 268 or 277. In FIG. 6, the shape in plan view of the relay electrode 267*a* is a square. Note that the shape in plan view of the relay electrode 267*a* is not limited to a square, and may be, for example, a circle or the like. Further, the shape in plan view of the relay electrode 267*a* may be different from the shape in plan view of the through hole 268 or 277.

The relay electrode 267*a* is composed of the same material as the second electrode 253 of the storage capacitor 250, and is collectively formed in the same film formation step as that of the second electrode 253, as described in more detail later. Therefore, compared to a case in which the relay electrode 267*a* and the second electrode 253 are formed in separate film formation steps, the manufacturing process of the electro-optical device 100 is simplified. Further, since the relay electrode 267*a* and the second electrode 253 are collectively formed after collective formation of the capacitance line 263 and the first electrode 251, a portion of the capacitance insulation film 252 is disposed between the relay electrode 267*a* and the capacitance line 263. Further, a portion of a protective film 278 for protecting other layers during formation of the relay electrode 267*a* is also disposed between the relay electrode 267*a* and the capacitance line 263. Note that the protective film 278 will be described in detail in the explanation of a method for manufacturing the electro-optical device 100 described later. Further, the capacitance insulation film 252 between the relay electrode 267*a* and the capacitance line 263 may be omitted.

The electro-optical device 100, as described above, includes the pixel electrode 220, the wiring line 266*b* serving as an example of the "first wiring line", the capacitance line 263 serving as an example of the "second wiring line", the insulating layer 275, the storage capacitor 250 serving as an example of the "capacitor", and the relay electrode 267*a*. The pixel electrode 220 is disposed in the display area A10. The insulating layer 275 is disposed between the wiring line 266*b* and the capacitance line 263. The storage capacitor 250 is disposed in the display area A10, and includes the first electrode 251, the capacitance insulation film 252, and the second electrode 253 stacked on the surface of the insulating layer 275 on the capacitance line 263 side in this order, with the first electrode 251 electrically connected to the capacitance line 263. The relay electrode 267*a* is disposed outside the display area A10, passes through the insulating layer 275, and is contacted with each of the surface of the wiring line 266*b* on the insulating layer 275 side and the surface of the capacitance line 263 on a side opposite to the insulating layer 275 side.

In the electro-optical device described above, both the coupling surface of the wiring line 266*b* with the relay electrode 267*a* and the coupling surface of the capacitance line 263 with the relay electrode 267*a* face the Z1 direction, which is rearward in the stacking order of the wiring line 266*b*, the insulating layer 275, and the capacitance line 263. Therefore, the relay electrode 267*a* can be formed after formation of the capacitance line 263. Further, the through hole 277 of the insulating layer 275 for passing the relay electrode 267*a* therethrough can be formed in the same step as that of the other holes after formation of the capacitance line 263. Accordingly, in a case in which a hole separate from the through hole 277 for the electrical coupling of the wiring line 266*b* and the capacitance line 263 is provided in the insulating layer 275, the manufacturing process of the electro-optical device 100 can be simplified. Further, the relay electrode 267*a* can be formed in the same step as that of the second electrode 253 and, here again, the manufacturing process of the electro-optical device 100 can be simplified. Moreover, because the relay electrode 267*a* is disposed outside the display area A10, formation of the relay electrode 267*a* in the same step as that of the second electrode 253 has the advantage that formation of the relay electrode 267*a* is easy compared to a case in which the relay electrode 267*a* is disposed in the display area A10.

Here, the electro-optical device 100 includes the external terminal 130*a* serving as an example of the "first external coupling terminal", and the external terminal 130*b* serving as an example of the "second external coupling terminal", each of which is disposed outside the display area A10. The external terminal 130*a* is connected to the wiring line 266*b*. On the other hand, the external terminal 130*b* is connected to the capacitance line 263 in a separate system from that of the external terminal 130*a*. Therefore, potentials can be supplied individually from the outside to each of the wiring line 266*b* and the capacitance line 263. As described above, because the wiring line 266*b* and the capacitance line 263 are connected via the relay electrode 267*a*, fluctuations in these potentials can be reduced even when the potentials are respectively supplied from the external terminals 130*a*, 130*b*.

A common potential is supplied to the wiring line 266*b* and the capacitance line 263. Therefore, the difference between the potential supplied to the wiring line 266*b* and the potential supplied to the capacitance line 263 can be reduced.

The common potential of this exemplary embodiment is a fixed potential. Therefore, the fixed potential can be supplied to the first electrode 251 of the storage capacitor 250.

Further, the capacitance line 263 is integrated with the first electrode 251. Therefore, the capacitance line 263 and the first electrode 251 can be collectively formed in the same film formation step.

Further, the electro-optical device 100 includes the TFT 240 serving as an example of the "switching element", and the scanning line 261. The TFT 240 is electrically connected to the pixel electrode 220 via the storage capacitor 250. The scanning line 261 is electrically connected to the TFT 240, and is composed of a metal. The second electrode 253 is composed of the same material as the scanning line 261. Therefore, the scanning line 261 and the second electrode 253 can be formed using the same film formation device. As a result, here again, the manufacturing process of the electro-optical device 100 can be simplified.

The through hole 268 is provided in the capacitance line 263. The relay electrode 267*a* is contacted with the wiring line 266*b* inside the through hole 268 as viewed from a thickness direction of the insulating layer 275. Further, the relay electrode 267*a* is contacted with the capacitance line 263 in the peripheral direction of the through hole 268. Thus, compared to a case in which the through hole 268 is not used, the coupling area of the relay electrode 267*a* and the wiring line 266*b* can be increased while reducing the area of the relay electrode 267*a* in plan view.

1-5. Method for Manufacturing Electro-optical Device 100

Figure 7:
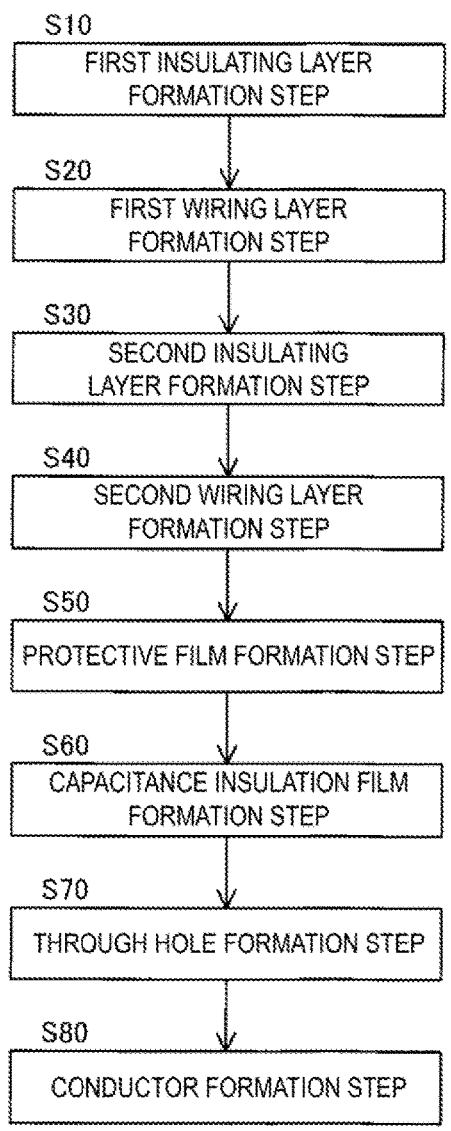
FIG. 7 is a drawing illustrating a flow of a method for manufacturing the electro-optical device according to an exemplary embodiment.

FIG. 7 is a drawing illustrating a flow of a method for manufacturing the electro-optical device 100 according to an exemplary embodiment. In FIG. 7, of the manufacturing process of the electro-optical device 100, the manufacturing process from formation of the insulating layer 274 to formation of the second electrode 253 and the relay electrode 267*a* is demonstrated. Note that other structures of the electro-optical device 100 can be manufactured by known methods.

As illustrated in FIG. 7, the method for manufacturing the electro-optical device 100 includes a first insulating layer formation step S10, a first wiring line formation step S20, a second insulating layer formation step S30, a second wiring line formation step S40, a protective film formation step S50, a capacitance insulation film formation step S60, a through hole formation step S70, and a relay electrode formation step S80. Each of the steps will be described in order below.

Figure 8:
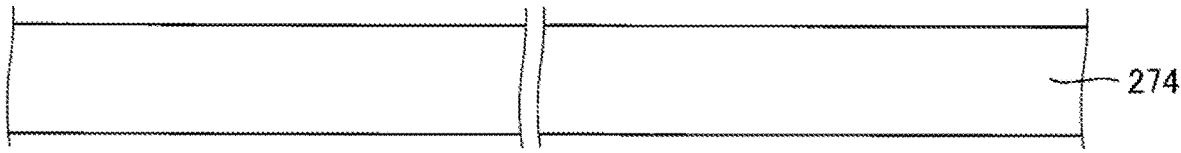
FIG. 8 is a cross-sectional view for explaining a first insulating layer formation step.

FIG. 8 is a cross-sectional view for explaining the first insulating layer formation step S10. In the first insulating layer formation step S10, as illustrated in FIG. 8, the insulating layer 274 is formed. To form the insulating layer 274, a vapor deposition method such as a chemical vapor deposition (CVD) method, for example, is used. Further, on the insulating film 274, a flattening treatment is performed by a chemical mechanical polishing (CMP) method or the like, as necessary. Note that, although not illustrated in FIG. 8, prior to formation of the insulating layer 274, layers closer to the first substrate 210 than the insulating layer 274 are formed sequentially on the first substrate 210, and the insulating layer 274 is formed on the insulating layer 273.

Figure 9:
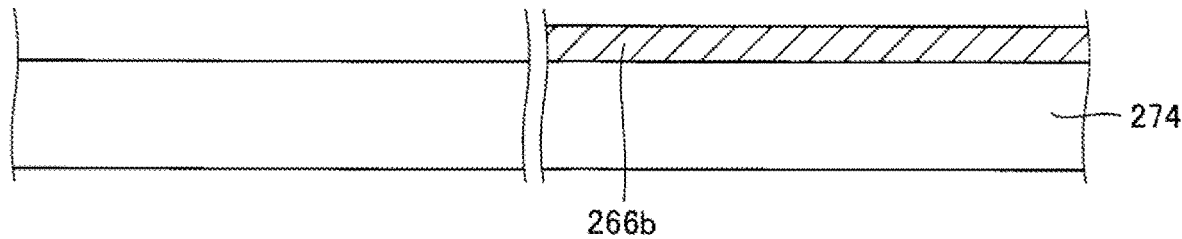
FIG. 9 is a cross-sectional view for explaining a first wiring line formation step.

FIG. 9 is a cross-sectional view for explaining the first wiring line formation step S20. In the first wiring line formation step S20, as illustrated in FIG. 9, the wiring line 266*b* is formed on the insulating layer 174. To form the wiring line 266*b*, a vapor deposition method such as a sputtering method or a CVD method, for example, is used. More specifically, the wiring line 266*b* is obtained by forming a metal film by the vapor deposition method and etching the metal film using a resist mask.

Although not illustrated, in the first wiring line formation step S20, in addition to the wiring line 266*b*, the wiring lines 266*a*, 266*b*, 266 and the signal line 262 are collectively formed on the insulating layer 274.

Figure 10:
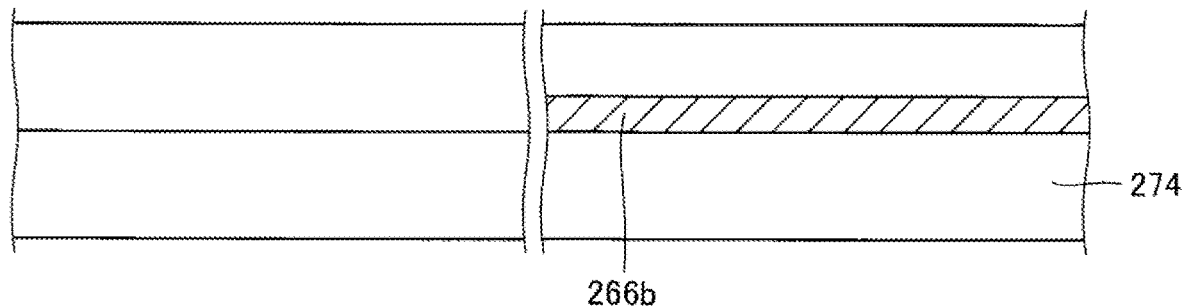
FIG. 10 is a cross-sectional view for explaining a second insulating layer formation step.

FIG. 10 is a cross-sectional view for explaining the second insulating layer formation step S30. In the second insulating layer formation step S30, as illustrated in FIG. 10, the insulating layer 275 is formed on the insulating layer 274 so as to cover the wiring line 266*b*. Similar to the formation of the insulating layer 274, to form the insulating layer 275, a vapor deposition method such as a chemical vapor deposition (CVD) method, for example, is used. Further, on the insulating film 275, a flattening treatment is performed by a chemical mechanical polishing (CMP) method or the like, as necessary.

Figure 11:
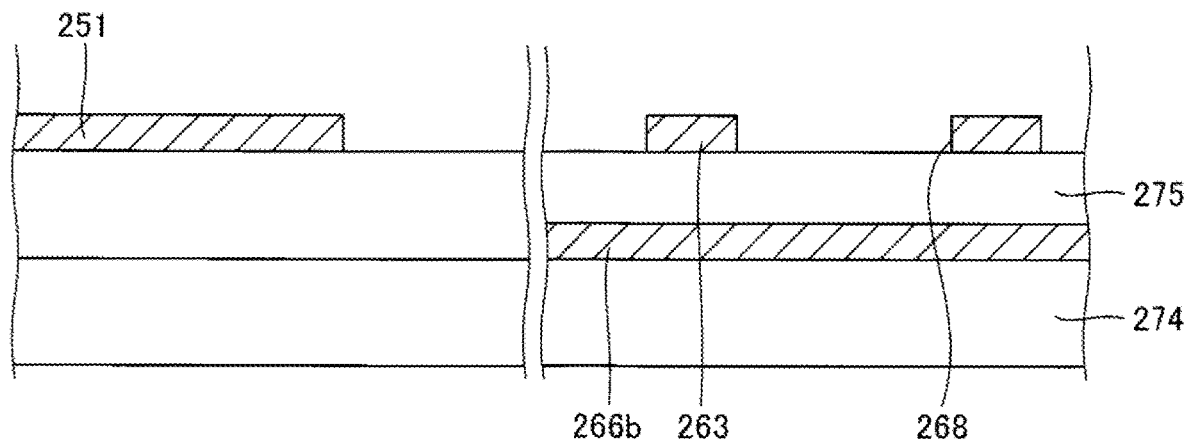
FIG. 11 is a cross-sectional view for explaining a second wiring line formation step.

FIG. 11 is a cross-sectional view for explaining the second wiring line formation step S40. In the second wiring line formation step S40, as illustrated in FIG. 11, the capacitance line 263 and the first electrode 251 are formed on the insulating layer 275. To form the capacitance line 263 and the first electrode 251, a vapor deposition method such as a sputtering method or a CVD method, for example, is used. More specifically, for example, the capacitance line 263 and the first electrode 251 are each obtained by forming a metal film by the vapor deposition method and etching the metal film using a resist mask. The metal film is, for example, a laminate obtained by sequentially forming a titanium nitride film, an aluminum film, and a titanium nitride film.

Figure 12:
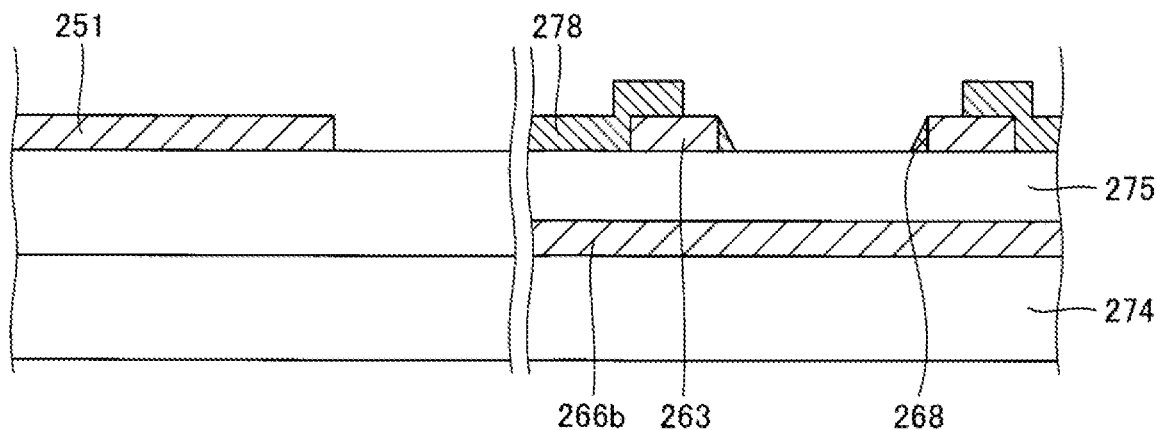
FIG. 12 is a cross-sectional view for explaining a protective film formation step.

FIG. 12 is a cross-sectional view for explaining the protective film formation step S50. In the protective film formation step S50, the protective film 278 is formed on the insulating layer 275 so as to expose a portion of the capacitance line 263 and a portion of the insulating layer 275 inside the through hole 268, as illustrated in FIG. 12. The protective film 278 is a film that protects the capacitance line 263 and the like from etching in the relay electrode formation step S80 described later. Similar to the formation of the insulating layer 274, to form the protective film 278, a vapor deposition method such as a chemical vapor deposition (CVD) method, for example, is used. More specifically, for example, the protective film 278 is obtained by forming a silicon oxide film by the vapor deposition method and etching the silicon oxide film using a resist mask.

Figure 13:
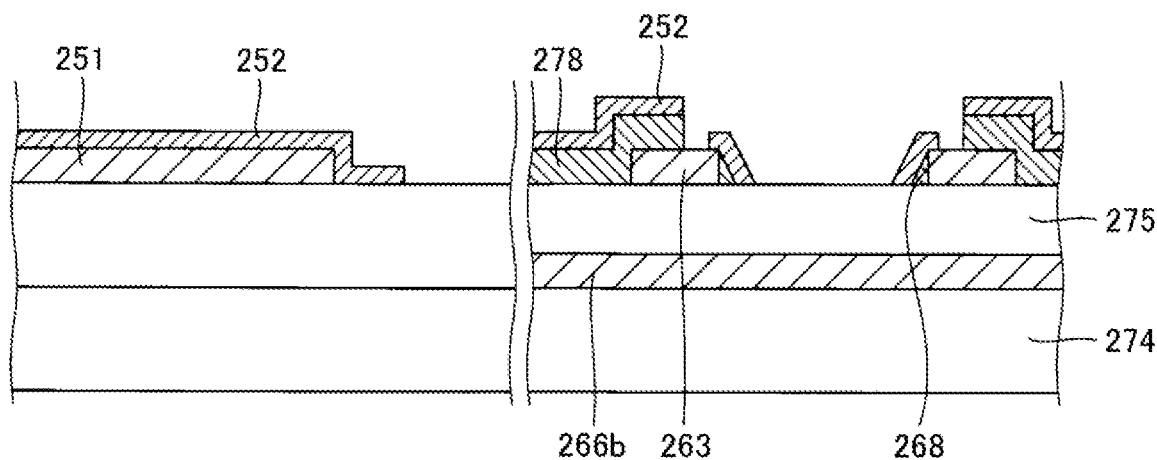
FIG. 13 is a cross-sectional view for explaining a capacitance insulation film formation step.

FIG. 13 is a cross-sectional view for explaining the capacitance insulation film formation step S60. In the capacitance insulation film formation step S60, the capacitance insulation film 252 is formed on the first electrode 251 and on the protective film 278, as illustrated in FIG. 13. To form the capacitance insulation film 252, an ALD method or the like, for example, is used. More specifically, for example, the capacitance insulation film 252 is obtained by forming a multilayer film of a hafnium oxide film and an aluminum oxide film using an ALD method or the like, and etching the multilayer film using a resist mask. As necessary, the multilayer film is subjected to heat treatment to improve pressure resistance.

Figure 14:
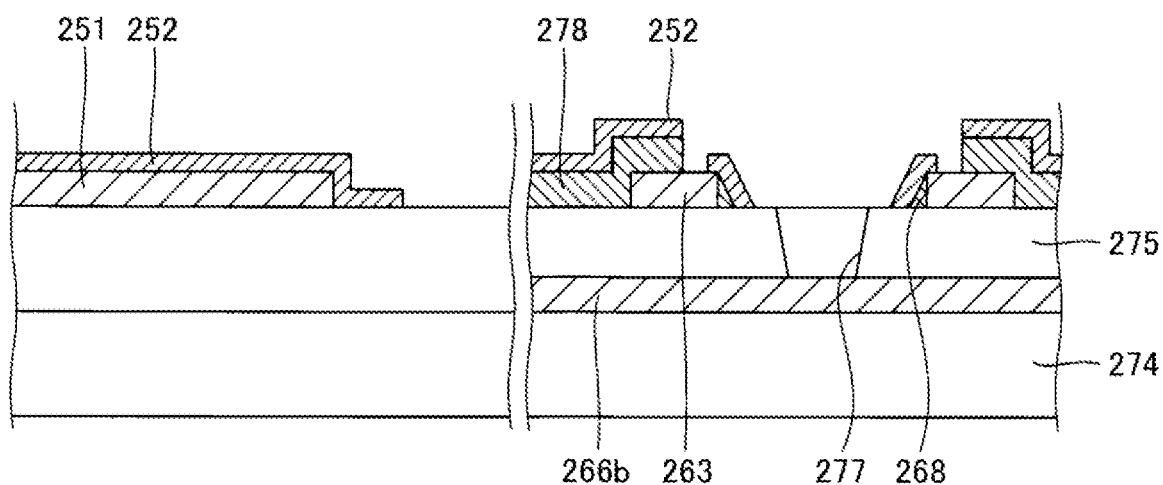
FIG. 14 is a cross-sectional view for explaining a through hole formation step.

FIG. 14 is a cross-sectional view for explaining the through hole formation step S70. In the through hole formation step S70, as illustrated in FIG. 14, the through hole 277 is formed in the insulating layer 275. To form the through hole 277, dry etching using a fluorine-based etching gas, for example, is used.

Although not illustrated, in the through hole formation step S70, in addition to the through hole 277, contact holes used for coupling the wiring line 266*a* and the second electrode 253 of the storage capacitor 250, contact holes used for coupling the wiring line 266*b* and the wiring line 267*b*, and contact holes used for coupling the wiring line 266*c* and the wiring line 267*c* are collectively formed in the insulating layer 275.

Figure 15:
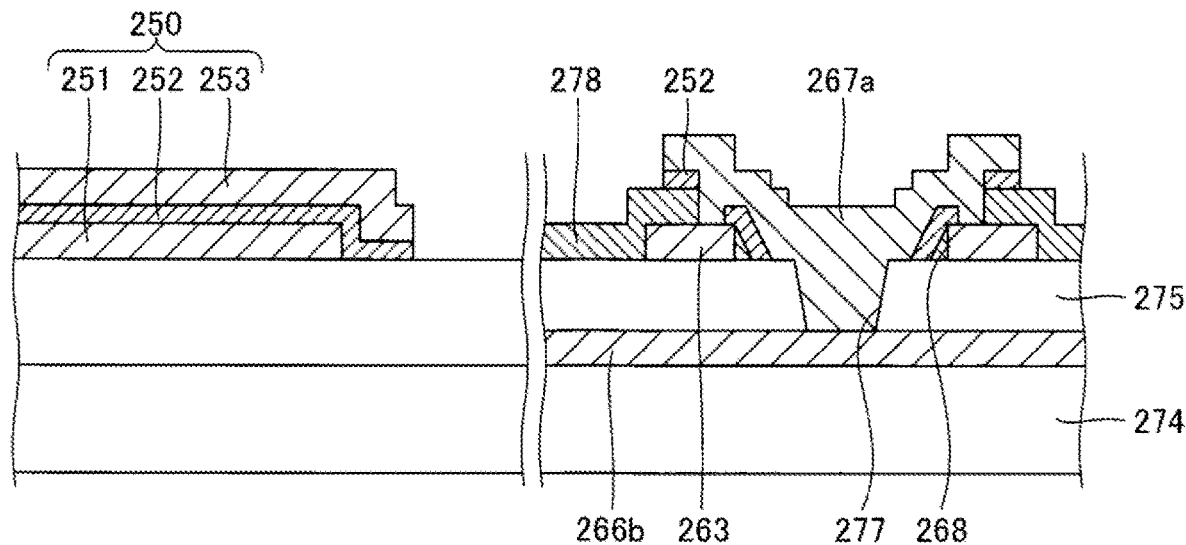
FIG. 15 is a cross-sectional view for explaining a relay electrode formation step.

FIG. 15 is a cross-sectional view for explaining the relay electrode formation step S80. In the relay electrode formation step S80, as illustrated in FIG. 15, the second electrode 253 and the relay electrode 267*a* are formed. To form the second electrode 253 and the relay electrode 267*a*, a vapor deposition method such as a sputtering method or a CVD method, for example, is used. More specifically, for example, the second electrode 253 and the relay electrode 267*a* are each obtained by forming a metal film by the vapor deposition method and etching the metal film using a resist mask. The metal film is, for example, a laminate obtained by sequentially forming a titanium nitride film, an aluminum film, and a titanium nitride film.

Although not illustrated, in the relay electrode formation step S80, in addition to the second electrode 253 and the relay electrode 267*a*, the wiring lines 267*b*, 267*c* are collectively formed.

As described above, the method for manufacturing the electro-optical device 100 includes the second insulating layer formation step S30, the second wiring line formation step S40, the capacitance insulation film formation step S60, the through hole formation step S70, and the relay electrode formation step S80, and these are performed in this order.

The second insulating layer formation step S30 forms the insulating layer 275 on the wiring line 266b, which is the first wiring line. The second wiring line formation step S40 forms the capacitance line 263, which is the second wiring line, and the first electrode 251 on the insulating layer 275. The capacitance insulation film formation step S60 forms the capacitance insulation film 252 on the first electrode 251. The through hole formation step S70 forms the through hole 277 in the insulating layer 275 to the wiring line 266b. The relay electrode formation step S80 forms the second electrode 253 on the capacitance insulation film 252, and forms the relay electrode 267a that couples, via the through hole 277, the wiring line 266b and the capacitance line 263.

In the method for manufacturing the electro-optical device 100 described above, even in a case in which a hole separate from the through hole 277 for the electrical coupling of the wiring line 266b and the capacitance line 263 is provided in the insulating layer 275, the manufacturing process of the electro-optical device 100 can be simplified.

2. Electronic Apparatus

The electro-optical device 100 can be used for various electronic apparatuses.

Figure 16:
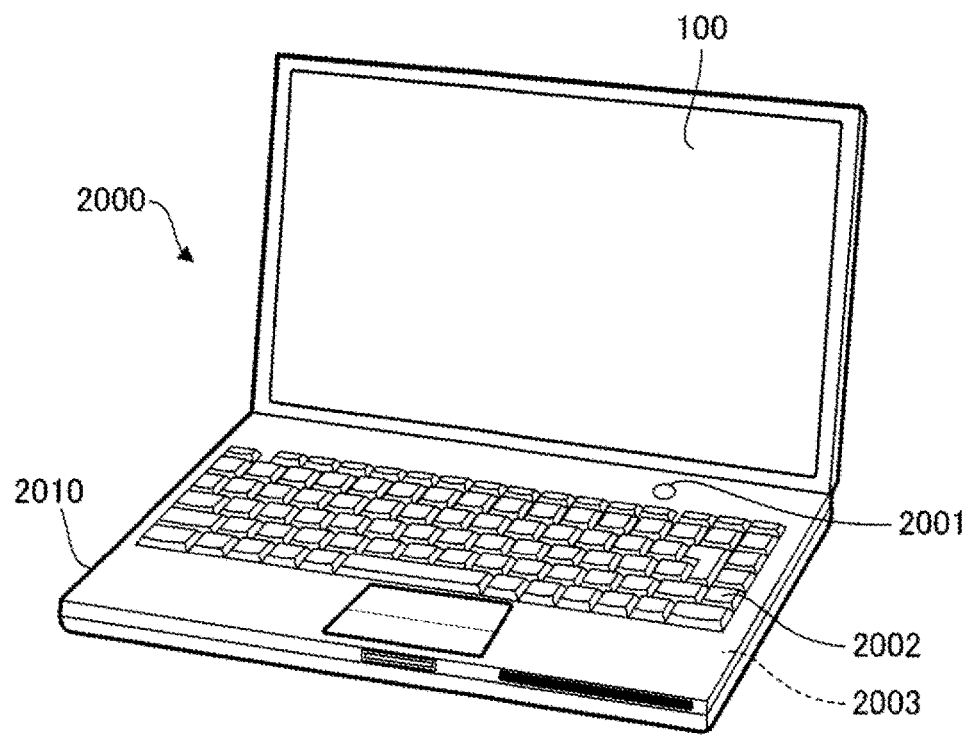
FIG. 16 is a perspective view illustrating a personal computer as an example of an electronic apparatus.

FIG. 16 is a perspective view illustrating a personal computer 2000 as an example of an electronic apparatus. The personal computer 2000 includes the electro-optical device 100 configured to display various images, a main body portion 2010 in which a power switch 2001 and a keyboard 2002 are installed, and a control unit 2003. The control unit 2003 includes a processor and a memory, for example, and controls the operation of the electro-optical device 100.

Figure 17:
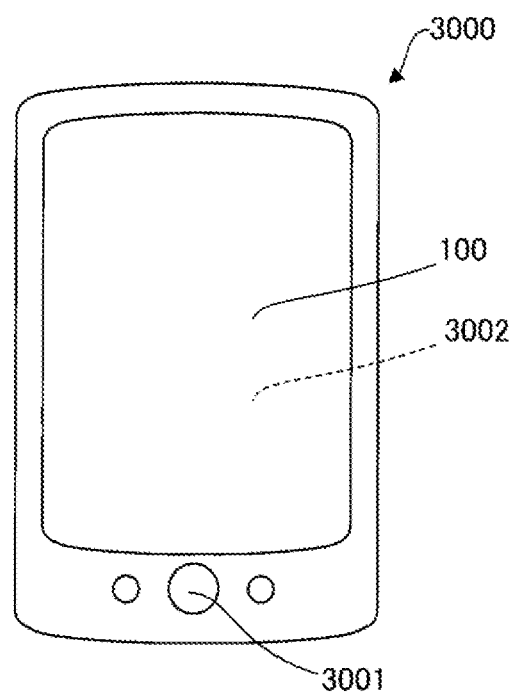
FIG. 17 is a perspective view illustrating a smart phone as an example of the electronic apparatus.

FIG. 17 is a perspective view illustrating a smart phone 3000 as an example of an electronic apparatus. The smartphone 3000 includes an operation button 3001, the electro-optical device 100 that displays various images, and a control unit 3002. The screen content displayed on the electro-optical device 100 is changed in accordance with the operation of the operation button 3001. The control unit 3002 includes a processor and a memory, for example, and controls the operation of the electro-optical device 100.

Figure 18:
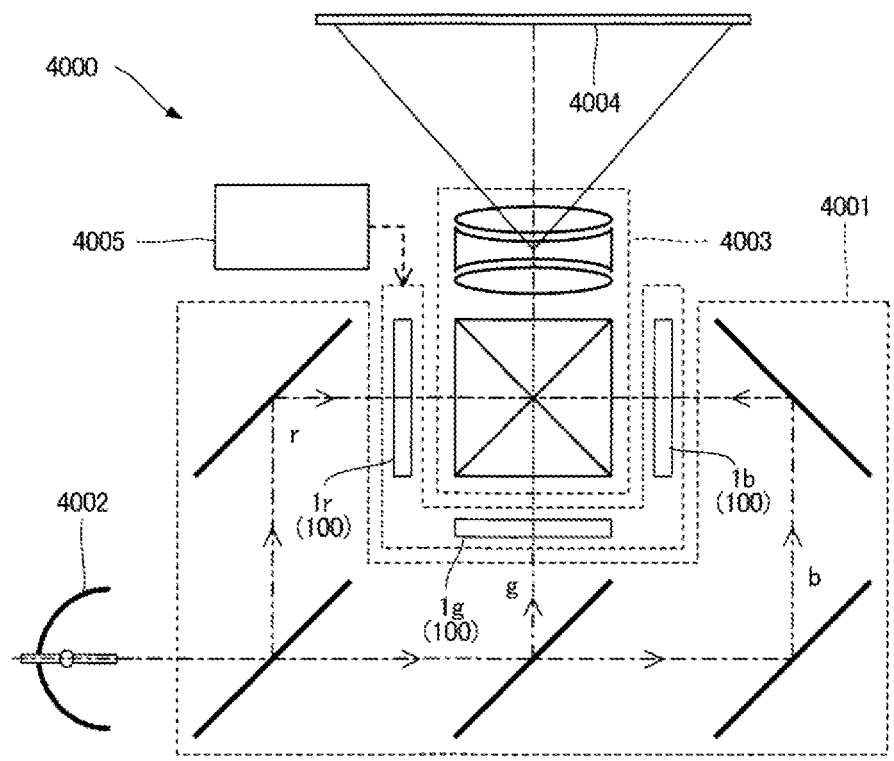
FIG. 18 is a schematic diagram illustrating a projector as an example of the electronic apparatus.

FIG. 18 is a schematic diagram illustrating a projector as an example of an electronic apparatus. A projection-type display device 4000 is a three-plate type projector, for example. An electro-optical device 1r is an electro-optical device 100 corresponding to a red display color, an electro-optical device 1g is an electro-optical device 100 corresponding to a green display color, and an electro-optical device 1b is an electro-optical device 100 corresponding to a blue display color. Specifically, the projection-type display device 4000 includes the three electro-optical devices 1r, 1g, and 1b that respectively correspond to the display colors of red, green, and blue. A control unit 4005 includes a processor and a memory, for example, and control the operation of the electro-optical devices 100.

An illumination optical system 4001 supplies a red element r of light emitted from an illumination device 4002 as a light source to the electro-optical device 1r, a green element g of the light to the electro-optical device 1g, and a blue element b of the light to the electro-optical device 1b. Each of the electro-optical devices 1r, 1g, and 1b functions as an optical modulator, such as a light valve, that modulates respective rays of the monochromatic light supplied from the illumination optical system 4001 depending on display images. A projection optical system 4003 combines the rays of the light emitted from each of the electro-optical devices 1r, 1g, and 1b to project the combined light onto a projection surface 4004.

The electronic apparatuses described above each include the above-described electro-optical device 100 and the control unit 2003, 3002, or 4005. As described above, in the electronic apparatuses described above, the manufacturing process of the electro-optical device 100 can be simplified, and therefore the cost of the personal computer 2000, the smartphone 3000, or the projection-type display device 4000 can be reduced.

Note that other examples of the electronic apparatus to which the electro-optical device according to the present disclosure is applied include a personal digital assistant (PDA), a digital still camera, a television, a video camera, a car navigation device, a display device for in-vehicle use, an electronic organizer, an electronic paper, an electronic calculator, a word processor, a workstation, a visual telephone, a point of sale (POS) terminal, and the like. Examples of the electronic apparatus to which the present disclosure is applied further include a device including a printer, a scanner, a copier, a video player, or a touch panel.

3. Modification Example

The present disclosure has been described above on the basis of the preferred exemplary embodiments, but the present disclosure is not limited to the exemplary embodiments described above. In addition, the configuration of each component of the present disclosure may be replaced with any configuration that exerts the equivalent functions of the above-described exemplary embodiments, and to which any configuration may be added.

In the embodiments described above, an example is given in which the wiring line 266b is the first wiring line and the capacitance line 263 is the second wiring line, but the present disclosure is not limited thereto. The first wiring line may be a wiring line positioned below the capacitor. Further, the second wiring line may be a wiring line positioned above the first wiring line and electrically connected to the first electrode of the capacitor.

In the embodiments described above, a configuration in which the relay electrode 267a is contacted with the capacitance line 263 across the entire periphery of the through hole 277 is illustrated, but the configuration is not limited thereto. For example, the relay electrode 267a may be contacted with the capacitance line 263 only partially in the peripheral direction of the through hole 277. Further, the through hole 268 of the capacitance line 263 may be omitted and, in this case, the relay electrode 267a may be disposed so as to straddle a side surface of the capacitance line 263.

Further, a direction of incidence of the light LL to the electro-optical device 100 may be a direction opposite to the direction in the above-described embodiments.

Further, in the explanations above, a liquid crystal display device is described as an example of the electro-optical device of the present disclosure, but the electro-optical device of the present disclosure is not limited thereto. For example, the electro-optical device of the present disclosure can also be applied to an image sensor or the like. Further, for example, the present disclosure can also be applied to a display panel that uses light-emitting devices such as organic electroluminescent (EL) devices, inorganic EL devices, and light-emitting polymers, similarly to the exemplary embodiments described above. Furthermore, the present disclosure can also be applied to an electrophoretic display panel that uses micro capsules, each including colored liquid and white particles distributed in the liquid, similarly to the exemplary embodiments described above.

Further, in the explanation above, the example of a switching element is the TFT, but the switching element is not limited thereto, and may be, for example, a metal-oxide-semiconductor field-effect transistor (MOSFET) or the like.

Further, in the embodiments described above, the electro-optical device 100 driven by an active matrix is illustrated, but the activation method of the electro-optical device may be a passive matrix driving method or the like, for example.

What is claimed is:

1. An electro-optical device comprising:
a first base;
an alignment film;
a first insulating layer disposed between the first base and the alignment film;
a second insulating layer disposed between the alignment film and the first insulating layer, the second insulating layer having a first surface that faces the alignment film;
a pixel electrode disposed between the alignment film and the second insulating layer in a display area;
a capacitor disposed between the pixel electrode and the second insulating layer in the display area, and including a first electrode, a capacitance insulation film, and a second electrode stacked in this order on the first surface of the second insulating layer;
a first wiring line disposed between the first insulating layer and the second insulating layer outside of the display area, the first wiring line having a second surface that faces the second insulating layer;
a second wiring line disposed between the alignment film and the second insulating layer outside of the display area on the first surface of the second insulating layer, and electrically connected to the first electrode, the second wiring line having a third surface that faces the alignment film; and
a relay electrode disposed outside of the display area, and through the second insulating layer, contacted with the first wiring line at the second surface of the first wiring line and the second wiring line at the third surface of the second wiring line.

2. The electro-optical device according to claim 1, wherein
a common potential is supplied to the first wiring line and the second wiring line.

3. The electro-optical device according to claim 2, wherein
the common potential is a fixed potential.

4. The electro-optical device according to claim 1, comprising:
a first external coupling terminal disposed outside the display area and electrically connected to the first wiring line; and
a second external coupling terminal disposed outside the display area and electrically connected to the second wiring line in a separate system from the first external coupling terminal.

5. The electro-optical device according to claim 1, wherein
the first electrode is disposed in a same layer as the second wiring line.

6. The electro-optical device according to claim 1, comprising:
a switching element electrically connected, via the capacitor, to the pixel electrode; and
a scanning line electrically connected to the switching element and composed of metal, wherein
the second electrode is composed of the same material as that of the scanning line.

7. The electro-optical device according to claim 1, wherein
the second wiring line is provided with a through hole, and
the relay electrode is contacted with the first wiring line inside the through hole as viewed from a thickness direction of the first insulating layer.

8. The electro-optical device according to claim 7, wherein
the relay electrode is contacted with the second wiring line in a peripheral direction of the through hole.

9. An electronic apparatus comprising:
the electro-optical device according to claim 1; and
a control unit configured to control operation of the electro-optical device.

* * * * *